United States Patent [19]
Goossen

[11] Patent Number: 5,977,571
[45] Date of Patent: Nov. 2, 1999

[54] LOW LOSS CONNECTING ARRANGEMENT FOR PHOTODIODES

[75] Inventor: Keith Wayne Goossen, Aberdeen, N.J.

[73] Assignee: Lucent Technologies, Inc., Murray Hill, N.J.

[21] Appl. No.: 09/030,800

[22] Filed: Feb. 26, 1998

[51] Int. Cl.[6] .................................................. H01L 31/00
[52] U.S. Cl. .......................... 257/184; 257/434; 257/448; 257/458; 257/459; 257/461; 257/758; 330/260; 330/271; 330/293; 330/299
[58] Field of Search ..................................... 257/433, 434, 257/448, 458, 461, 459, 184, 758; 330/299, 293, 260, 271

[56] References Cited

U.S. PATENT DOCUMENTS 4,904,861  2/1990  Epstein et al. ....................... 250/214 C
5,605,856  2/1997  Goosen et al. ............................ 437/51
5,834,845  11/1998  Stolmeijer ................................ 257/752

Primary Examiner—William Mintel

[57] ABSTRACT

Each of a plurality of photodiodes forming a photodetector is mounted on a respective metal pad on the surface of a semiconductor integrated circuit chip including a corresponding number of amplifier circuits for detecting the photocurrent from respective photodiodes. Each circuit comprises a high gain, high input impedance amplifier and a feedback element, typically a resistor of high value, connected across the amplifier between input and output nodes thereof. Each photodiode mounting metal pad and each feedback resistor is connected to a common input node of a respective amplifier by metal paths within a connecting structure forming part of the integrated circuit. Adverse effects on the output current from the photodiodes are reduced by forming a junction of the path from each feedback resistor with the path from the corresponding photodiode at the metal pad on which the photodiode is mounted, and interconnecting such junction along a common path to the corresponding amplifier input node.

9 Claims, 4 Drawing Sheets

LOW LOSS CONNECTING ARRANGEMENT FOR PHOTODIODES

BACKGROUND OF THE INVENTION

This invention relates to the use of photodiodes, and particularly to the interconnecting of a photodiode within an electronic circuit for improved efficiency of operation.

Photodiodes are known electronic components which generate electrical current in response to radiant energy. Principal uses of photodiodes are in photodetectors such as image sensors and photospectrometers.

Typically, a plurality of individual photodiodes are disposed in side by side array to define a light receiving area. A light pattern to be analyzed is projected onto the light receiving area and each photodiode generates a current in proportion to the intensity of the light falling thereon. If the original source of light has been separated by wavelength, so that each photodiode receives light of a different wavelength, the photodiode array functions as a photospectrometer for detecting and measuring the different wavelength components of the light source.

The output of each photodiode of the array is electrical current (referred to as "photocurrent"). Ideally, all the photodiodes forming a photodetector should have identical characteristics whereby the relative amplitudes of the current outputs of the various photodiodes precisely reflect the relative intensities of light incident thereon. Some variations in characteristics of the photodiodes are inevitable, however, and a task is to minimize the effects thereof.

In certain photodetector applications, described hereinafter, the photodiodes are operated at zero voltage bias and, when so operated, an equivalent circuit of the photodiodes comprises a radiant energy responsive current generator having two output terminals. A shunt resistor is connected between the two output terminals in parallel with the current generator, and a resistor is connected in series between the generator and one of the terminals. As described hereinafter, the shunt resistor represents a path for leakage current within the photodiode, and the series resistor represents intrinsic resistance to current flow outwardly from the photodiode.

The two resistors form a current divider internally of the photodiode in the path of the current from the current generator. That current which flows through the series resistor and to the one output terminal is available to contribute to the output signal of the photodiode. The current which flows through the shunt resistor circulates within the photodiode and is not available as output current.

Clearly, for maximum signal output, the shunt resistance is preferably as high as possible and the series resistance is as low as possible.

The magnitudes of the two photodiode resistors are a function of the design and fabrication of the photodiodes. The present invention is not concerned with the fabrication of photodiodes, but with the arrangements used for connecting photodiodes to the input nodes of amplifier circuits. The impact of such connecting arrangements is as follows.

With any given photodiode including the aforedescribed internal current divider, it is recognized that the functioning of the current divider can be influenced by how the photodiode is used. Specifically, if the path for current from the one output terminal from the photodiode to the input node of the amplifier circuit includes a resistance, such resistance can add to the series resistance portion of the photodiode current divider. Thus, a greater proportion of the current generated by the photodiode is lost to internal circulation.

Based upon the foregoing, it has been accepted heretofore that the output terminals of the photodiodes should be connected to the input nodes of respective amplifier circuits by connecting paths having the lowest possible resistances and, preferably, of identical resistance values. While known connecting arrangements largely accomplish this, some resistance is inevitably present in the connecting paths and, depending upon the geometries of the photodetecting devices, the resistances can vary from path to path. Thus, not only do the path resistances tend to reduce the output currents of the photodiodes, but the variable path resistances variably influence the photodiodes for magnifying existing differences among the photodiodes.

The present invention reduces the adverse effects of connecting path resistances.

SUMMARY OF THE INVENTION

In accordance with known technology, an output terminal of a photodiode is connected to an input terminal of a connecting structure, and the input terminal is connected by a first connecting path through the connecting structure to an input node of a high input impedance amplifier. A feedback element (typically a resistor of large value) is similarly connected, but by a second connecting path, through the connecting structure to the same input node of the amplifier. For reducing the effects of the resistance of the first connecting path on the photocurrent output from the photodiode, the second path from the feedback element is electrically connected to the first path at the input terminal of the connecting structure.

DESCRIPTION OF THE DRAWING

The drawings are schematic and are not to scale.

DESCRIPTION OF A PREFERRED EMBODIMENT OF THE INVENTION

Photodiodes are commonly used in certain applications where high speed response is not required, e.g., in photospectrometers. Where speed is not required, the photodiodes are typically operated at zero bias to reduce noise. At zero bias, the photodiodes (e.g., known InGaAs/InP photodiodes) tend to have poor rectification, that is, they usually have high reverse bias leakage current. Accordingly, an equivalent circuit model of a photodiode 10 operating at zero bias, and subject to high leakage current, is as shown in FIG. 1 (within a dashed box 10).

Figure 1:
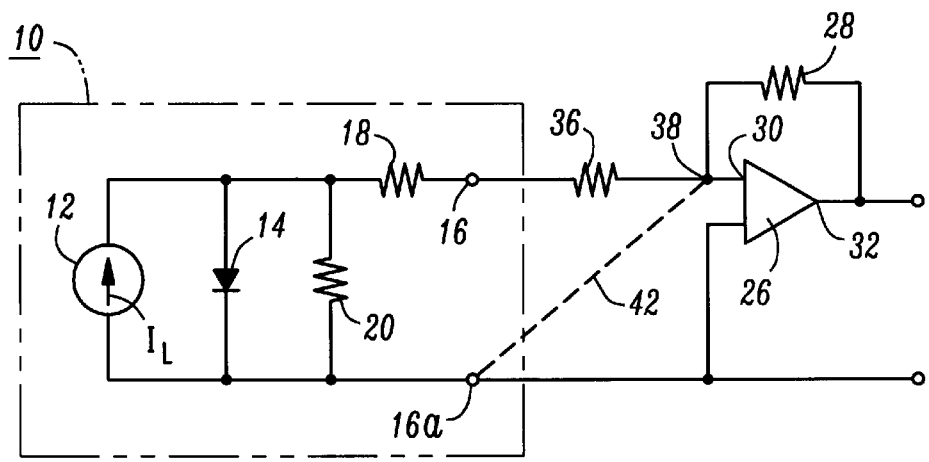
FIG. 1 is a circuit diagram illustrating a known arrangement both for evaluating and using a photodiode.

FIG. 1 shows the photodiode 10 as comprising a current generator 12 in parallel with an ideal diode 14. Photocurrent $I_L$ from the generator 12 exits and returns to the photodiode via output terminals 16 and 16a, and the intrinsic resistance associated with the path for current to the output terminals of the photodiode is represented by a resistor 18 in series with the output terminal 16. (For a reason made evident hereinafter, the series resistor 18 includes any resistances associated with the bonding of the output terminals 16 and 16a to external members.) A path for leakage currents past the ideal diode 14 is represented by a shunt resistor 20 in parallel with the diode 14 and connected between the output terminals 16 and 16a.

The two resistors 18 and 20 comprise a current divider for the current generated by the current generator 12, and to the extent that current flows through the shunt resistor 20, the current available from the photodiode is reduced.

To determine the reduction in photocurrent caused by the circuit divider provided by the two resistors 18 and 20, the photodiode 10 is shown in FIG. 1 connected to a high gain, high input impedance operational amplifier 26 used in combination with a negative feedback circuit element 28 connected between an input node 30 of the amplifier 26 and an output node 32 thereof. The operational amplifier can be of known type typically used in known photodetector devices for current to voltage conversion. In FIG. 1, the circuit element 28 is shown as a resistor, as is most typical. Other feedback circuit elements, e.g., capacitors, transistor circuits and the like, can be used. FIG. 1 also shows a resistor 36 connected in series between the photodiode output terminal 16 and a junction 38 of the feedback resistor 28 with the input node 30 of the amplifier 26.

Figure 2:
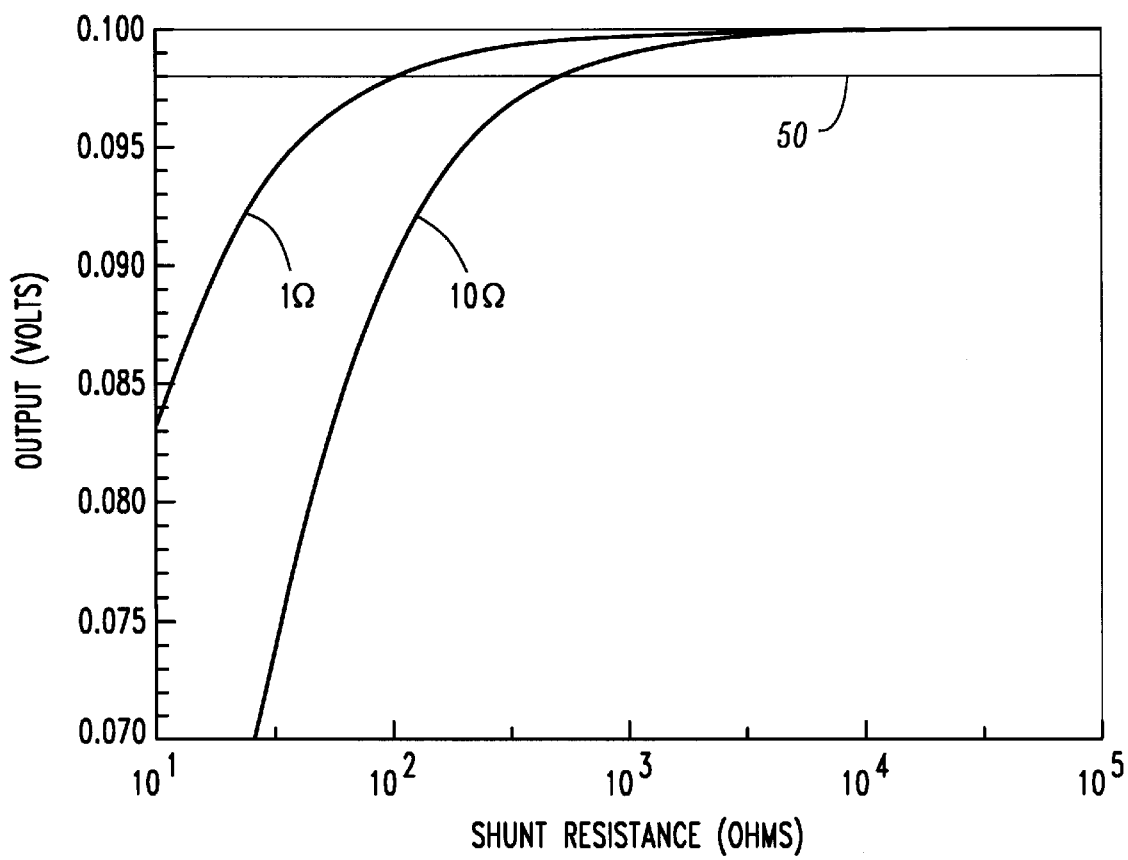
FIGS. 2 and 3 are graphs for illustrating the effects of photodiode intrinsic series resistance on the photocurrent output from the photodiode.

The FIG. 1 circuit is analyzed (mathematically, using known techniques) for a generated photocurrent $I_L$ of 1 $\mu A$ from the photogenerator 12, an amplification gain of the amplifier 26 of $10^5$ (the amplifier having an input impedance in excess of $10^6$ ohms), and a feedback resistor of $10^5$ ohms (such parameters being typical in known photodetector circuits). The result of such analysis is shown in FIG. 2 which plots output voltage of the amplifier 26 (ordinate) against shunt resistance 20 of the photodiode 10 for two different values (1 ohm and 10 ohm) of the series resistance 18. (For the present, the series resistance 36 is assumed to be zero.)

As previously noted, the design and fabrication of photodiodes is not the subject of the present invention. The particular values for the shunt 20 and series 18 resistances are those measured for typical photodiodes which might be found in a typical photodetector.

At extremely high shunt resistance values, i.e., in excess of $10^4$ ohms, the leakage current through the shunt resistor 20 is so small that no significant reduction of photodiode output current occurs, and the amplifier circuit output voltage (0.100 volt) is the same for both values of series resistance. With decreasing values of shunt resistance, however, the amplifier circuit output voltage begins to fall, but at a faster rate for the 10 ohm curve than for the 1 ohm curve. This is expected based upon the foregoing discussion explaining that the two resistors 18 and 20 (FIG. 1) of the photodiodes form a current divider for the generated photocurrent.

Figure 3:
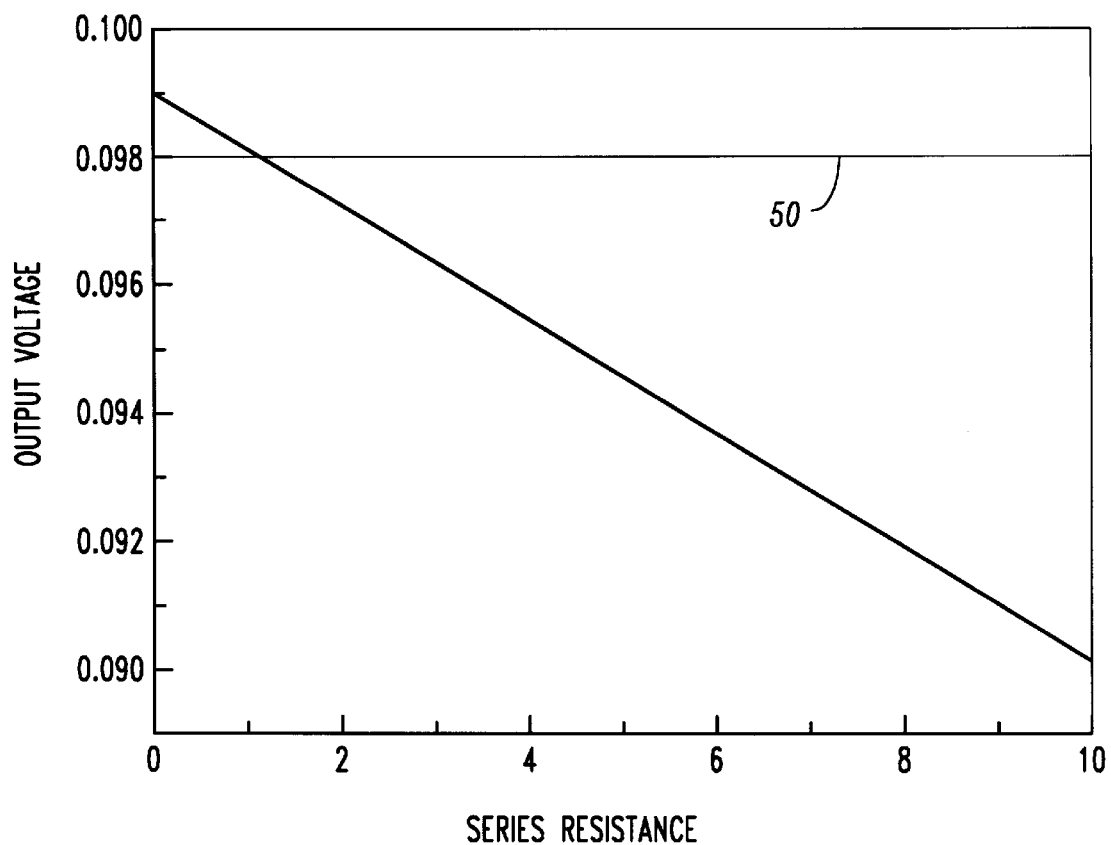

Another way of illustrating the matter is shown in FIG. 3 which plots amplifier circuit output voltage against series resistance for a fixed shunt resistance. This graph shows that for a given photodiode (e.g., having a shunt resistance of 100 ohms), the amplifier output voltage is directly proportional to the value of the series resistance in the circuit. The same output voltage variation occurs with other photodiodes having different shunt resistances, and the conclusion, as previously described, is that higher amplifier output voltages are obtained the lower is the series resistance of the photodiodes.

The practical significance of the foregoing is now explained in connection with assuming that the resistance 36 (FIG. 1) in the path of current between the photodiode terminal 16 and the amplifier circuit junction 38 has some value, even if quite small, as hereinafter discussed.

The design and operation of known operational amplifier circuits similar to that formed by the amplifier 26 and the feedback element 28 shown in FIG. 1 are rather complex. It is possible, however, for the purposes of the present invention, to explain that the amplifier 26, in direct response to current arriving at the junction node 38, generates a current through the feedback element 28 which is exactly equal and opposite to the photocurrent arriving at the node 38, whereby the sum of currents to and from the node 38 is zero.

Stated slightly differently, as far as the photocurrent from the photodiode 10 is concerned, the junction node appears exactly as if the node 38 were shorted, as shown by the dashed line 42, directly back to the photodiode 10.

In terms of the effects upon the current from the photodiode 10, any circuit parameters beyond the connection of the current path from the photodiode with the junction node 38 are part of the operational amplifier circuit, hence are not "seen" by the photodiode 10 as being masked by the overall operation of the amplifier circuit. (While the functioning of operational amplifiers is known, the last comment, concerning what is actually "seen" by the photodiodes, is part of the inventive recognition made by the inventor herein leading to the present invention. This is discussed further hereinafter.)

In FIG. 1, the resistance 36 is shown in the path of the photocurrent to the junction node 38, hence the resistance 36 is "seen" by the photodiode 10, and the resistance 36 adds directly to the value of the photodiode series resistance 18. Accordingly, the effect of series resistance on the amplifier output voltage (as illustrated in FIGS. 2 and 3) is actually that caused by the sum of the intrinsic series resistance 18 of the photodiode, which is a function of how the photodiode is fabricated, and the resistance 36 external to the photodiode, which is a function of how the photodiode is interconnected to the junction node 38 of the amplifier circuit.

Another way of understanding the importance of the foregoing is as follows. Assume that in a given photodetector including an array of individual photodiodes, it is desired that all the diodes have uniform output currents (for equal radiant energy inputs) within a tolerance of ±1%. That is, the photodiode quality standard requires that the worst photodiode of the array generates a photocurrent at least 98% of the photocurrent from a perfect (zero leakage) photodiode.

This quality requirement is indicated in FIG. 2. For ideal photodiodes, i.e., having extremely high shunt resistance, the amplifier output voltage is 0.100 volt. The quality minimum allowable output voltage is thus 0.098 volt, and such quality standard is indicated by the horizontal line 50. Because of manufacturing variations, the various photodiodes have respectively different shunt resistances less than that of perfect devices. From FIG. 2, it is seen that, for an effective series resistance (the sum of the resistances 18 and 36 in FIG. 1) of 10 ohms, photodiodes having a shunt resistance (as manufactured) less than around 500 ohms fall below the specification limit of 0.098 volt. Conversely, with an effective series resistance of 1 ohm, acceptable results (i.e., outputs in excess of 0.98 volt) are obtained with photodiodes having shunt resistances as low as around 100 ohms.

For the foregoing reasons, prior art practice has been to design photodetector devices, including a number of photodiodes respectively interconnected to a like number of amplifier circuits, with interconnections having as low a resistance as is possible. While it is likely that means can be provided for even further reducing the resistances in the interconnections, the present invention provides a different approach to the problem.

Figure 6:
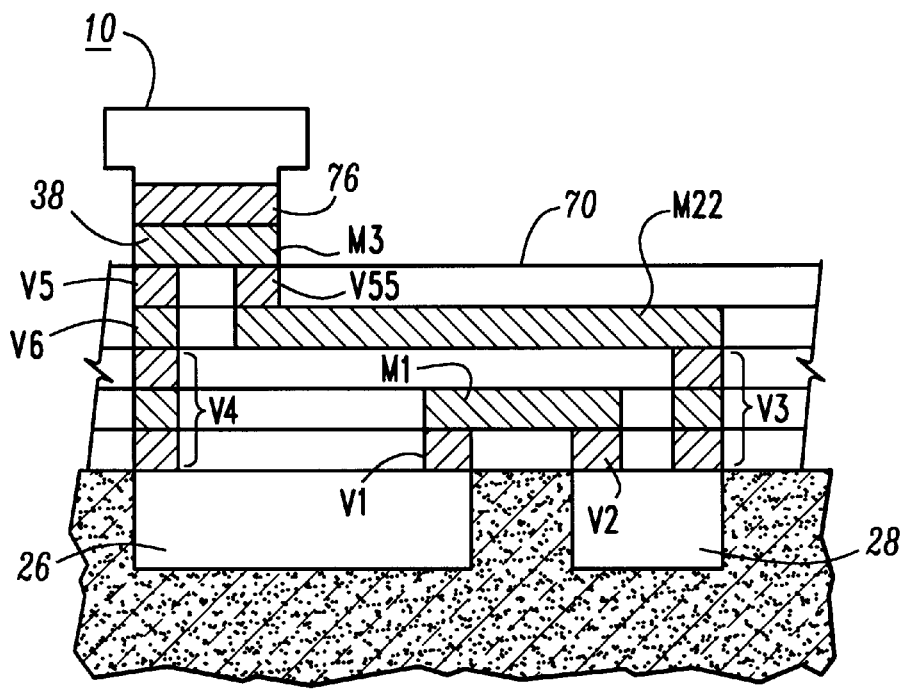
FIGS. 6 and 7 are similar to FIGS. 4 and 5, respectively, but illustrating one embodiment of the present invention.

One embodiment of the invention will be described hereinafter in the form of a modification of a known photodetector 60 illustrated in FIG. 4. Because the detector 60 is known, it is shown schematically in FIG. 4 (as well as in FIG. 6 showing the inventive modification). A similar known photodetector is shown (in slightly greater detail) in U.S. Pat. No. 5,605,856 issued Feb. 25, 1997 to myself and others. (The subject matter of this patent, as well as that of the patents cited therein, is incorporated herein by reference.)

Figure 4:
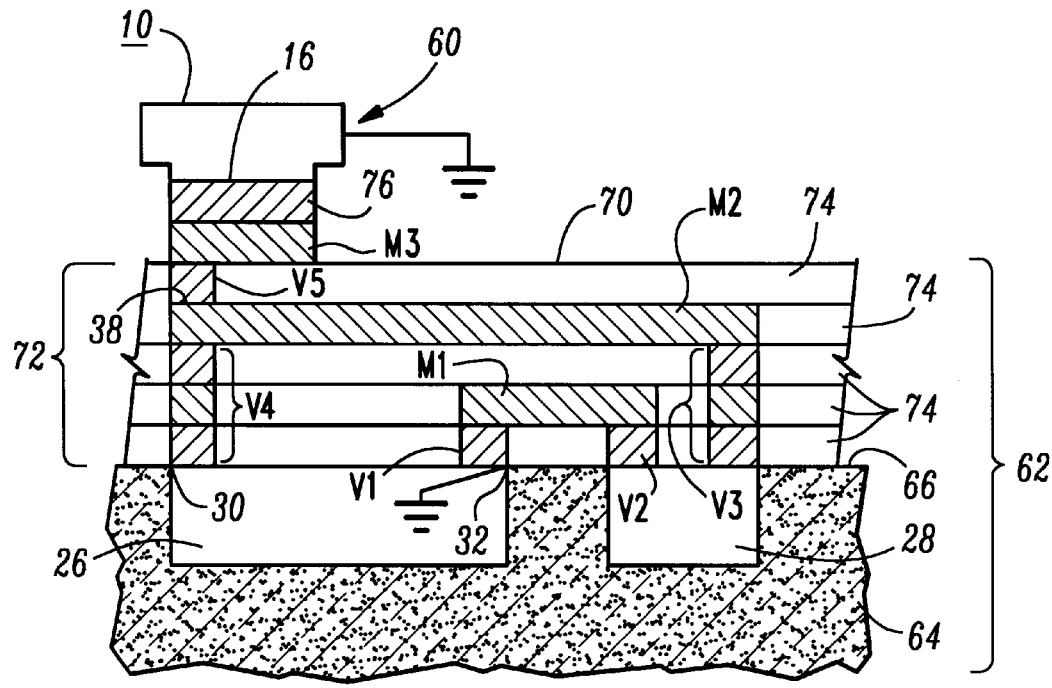
FIG. 4 is a view showing a known mounting of a photodiode on an integrated circuit and the interconnecting scheme between the photodiode and an amplifier circuit of the integrated circuit.

The known photodetector 60 shown in FIG. 4 is made using known semiconductor integrated circuit techniques and, in this example, comprises a semiconductor chip 62 including a substrate 64 of silicon containing therein various doped regions so interconnected to form a plurality of amplifiers 26 and a corresponding plurality of feedback resistors 28. FIG. 4 shows just one small portion of the chip used in conjunction with one photodiode 10. Various interconnections needed for forming the amplifier 26 are disposed both within the substrate 64 and on a surface 66 of the substrate. All of this is known, and of interest herein are only certain interconnections between the amplifier 26, the feedback resistor 28, and one terminal 16 of a photodiode 10 mounted on an upper surface 70 of a stack 72 of layers formed on the substrate surface 66.

The stack 72 (shown schematically) comprises various horizontal layers 74 of insulating material, various horizontal layers Mn of metal insulated from one another by intervening insulating material layers, and electrical interconnections Vn, known as "vias", extending vertically through the insulating material layers 74 for electrically interconnecting otherwise electrically isolated metal layers M. The stack arrangement shown is extensively used because, among other things, it allows the crossing of metal interconnections (on respective levels of the stack) and great flexibility in the layout and interconnecting of complex devices.

In FIG. 4, the feedback resistor 28 is connected to an output node 32 of the amplifier 26 by two vias $V_1$ and $V_2$ connected in turn by a metal layer $M_1$. Similarly, the feedback resistor 28 is connected to an input node 30 of the amplifier 26 by two via stacks $V_3$ and $V_4$ (of three vias each) interconnected by a metal layer $M_2$. The metal layer $M_2$ is connected, by a single via $V_5$, to a metal pad $M_3$ on the top surface 70 of the multi-layer stack 72. The photodiode 10 is solder bonded (by a solder joint 76) to the metal pad $M_3$, thus electrically connecting the terminal 16 of the photodiode 10 to the input node 30 of the amplifier 26. The interconnection between the via $V_5$ and the metal layer $M_2$ is at a junction labeled 38.

As mentioned, FIG. 4 shows but one photodiode 10 mounted on the chip 62. In practice, other photodiodes, e.g., all part of a common substrate mounted on the chip 62, are connected to respective spaced apart metal pads $M_3$ on the surface 70 of the stack 72 of the chip 62. For providing maximum space on the stack top surface 70 for the spaced apart pads $M_3$, and for minimizing the possibility of shorting together adjacent photodiodes by overlapping solder joints, the only metal layers on the stack surface 70 (at least within the array of adjacent photodiodes) are the metal pads $M_3$. All connections to the pads $M_3$ are from within the stack 72 by means of vias $V_5$. For similar reasons, other component interconnections, e.g., the metal layers $M_1$ and $M_2$, are buried within the stack 72 and not disposed on the stack surface 70.

Figure 5:
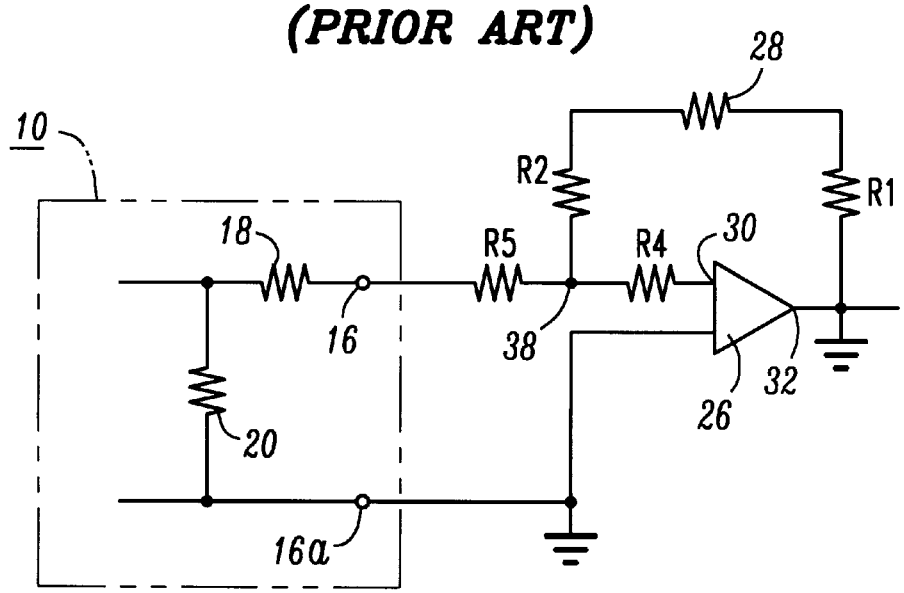
FIG. 5 is a circuit diagram corresponding to the structural arrangement shown in FIG. 4.

While the various metal layers $M_n$ and vias $V_n$ are of electrically conductive material, typically highly doped polycrystalline silicon, some electrical resistance is present, and such resistances of the conductive paths shown in FIG. 4 are indicated in FIG. 5, which is a schematic circuit diagram representative of the structural arrangement shown in FIG. 4. Thus, in FIG. 5, from the output node 32 of the amplifier 26 to the feedback resistor 28, a resistance $R_1$ is shown. From FIG. 4, the resistance $R_1$ comprises the series resistance provided by the two vias $V_1$ and $V_2$ and the metal layer $M_1$.

FIG. 5 shows a resistance $R_2$ between the feedback resistor 28 and a junction node 38 connected to an input node 30 of the amplifier 26 through a resistance $R_4$. From FIG. 4, the resistance $R_2$ comprises the series resistance provided by the via stack $V_3$ and the metal layer $M_2$. The resistance $R_4$ (FIG. 5) comprises, in FIG. 4, the series resistance provided by the via stack $V_4$. The junction node 38 shown in FIG. 5 corresponds to the previously referred to junction 38 in FIG. 4.

In FIG. 5, the junction node 38 is connected to an output terminal 16 of the photodiode 10 through a resistance $R_5$. In FIG. 4, such resistance comprises the series resistance provided by the via $V_5$ and the metal layer $M_3$ connecting the terminal 16 of the photodiode 10 to the metal pad $M_3$. (As previously noted, the resistance associated with the soldering of the terminal 16 to the metal pad $M_3$ is considered as being included within the photodiode intrinsic series resistance 18.)

Comparing FIG. 5 with FIG. 1, it is seen that the resistance $R_5$ in FIG. 5 corresponds to the resistance 36 in FIG. 1. Thus, the resistance $R_5$ adds to the internal series resistance 18 of the photodiode 10 and contributes, as previously described, towards the reduction of photocurrent from the photodiode.

While the actual value of the resistance $R_5$ varies depending upon the mounting arrangement used, in the known multi-layer connecting structure 72 shown in FIG. 4, typical vias $V_n$ can have resistances up to 10 ohms. Typical values for the intrinsic series resistance 18 of photodiodes are around one ohm. Thus, the resistance $R_5$ in the connecting structure from the photodiode output terminal 16 to the feedback resistor junction node 38 can have a large effect on the reduction of the photocurrent reaching the junction node 38.

Considering the resistances $R_4$ (FIG. 5) between the junction node 38 and the input node 30 of the amplifier 26, it was recognized (by the inventor herein, as previously noted) that this resistance has no effect on the output current from the photodiode 10 and, specifically, that this resistance does not add to the effective series resistance 18 of the photodiode. The reason for this, as previously explained, is that all the resistances between the junction node 38 and the amplifier 26 are part of the operational amplifier circuit and are not included in (or "seen" as part of) the path for current from the photodiode 10.

With the foregoing recognition by the inventor herein, it was then considered how to avoid the undesirable effect of the connection path resistance $R_5$ on the photodiode 10. The solution is as shown in FIGS. 6 and 7.

FIG. 6 is quite similar to FIG. 4 with the sole change being that, in FIG. 6, a horizontal metal layer $M_{22}$ connected to the via stack $V_3$ from the feedback resistor 28 does not extend into contact with the via $V_5$, but is connected instead to a separate via $V_{55}$ connected to the metal pad $M_3$ on which is soldered the photodiode 10. The via $V_5$ remains connected to the metal pad $M_3$, and an extra via $V_6$ is used for connecting the via $V_5$ to the via stack $V_4$. (In the absence of an advantage, as hereinafter explained, of adding the extra via $V_{55}$, such addition would be undesirable as adding to the manufacturing complexity and the space requirements of the structures.)

Figure 7:
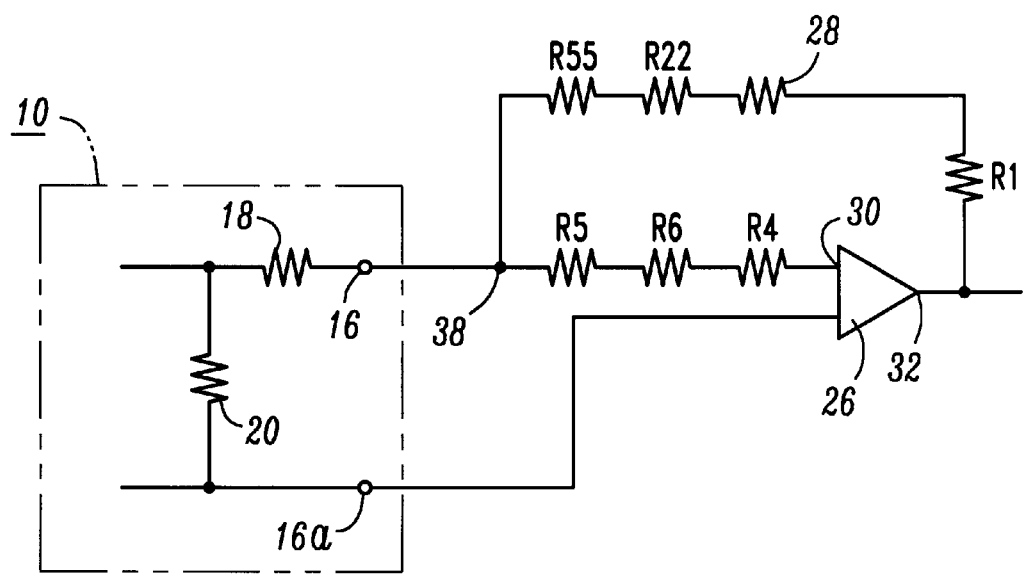

The effect of the extra via $V_{55}$ shown in FIG. 6 is evident from FIG. 7, which is a schematic circuit diagram representative of the structural arrangement shown in FIG. 6.

In FIG. 7, the resistance $R_{22}$ is the series resistance from the feedback resistor 28 through (FIG. 6) the via stack $V_3$ and the metal layer $M_{22}$. The resistance $R_{55}$ in FIG. 7 is the resistance of the via $V_{55}$ in FIG. 6.

In FIG. 6, the via $V_{55}$ is connected to the metal pad $M_3$ on which is solder bonded the photodiode 10, and the metal pad $M_3$ is connected to the input node 30 of the amplifier 26 by the vias $V_5$ and $V_6$ and the via stack $V_4$. Accordingly, the metal pad $M_3$ comprises the junction 38 of the connecting paths from the photodiode 10 and from the feedback resistor 28 with the path to the input node 30 of the amplifier.

In FIG. 7, this junction 38 is shown as the junction 38 of the photodiode output terminal 16, the resistance $R_{55}$ (via $V_{55}$), and the resistance $R_5$ (via $V_5$).

The resistance of the metal pad $M_3$ is not represented in FIG. 7. The pad resistance is quite small and can be considered as forming a small part of each of the resistances $R_{55}$ and $R_5$. Also, as previously noted, the resistance associated with the bonding of the photodiode 10 to the metal pad $M_3$ is considered as being part of the intrinsic series resistance 18 of the photodiode.

The advantage provided by the invention is evident from a comparison of FIGS. 5 and 7.

In FIG. 5, as previously described, the resistance $R_5$, corresponding to that of the via $V_5$ in FIG. 4, is on the photodiode side of the junction node 38. Accordingly, the resistance of the via $V_5$ of the connecting structure shown in FIG. 4 adds to the effective series resistance 18 of the photodiode 10.

In FIG. 7, conversely, the very same resistance, $R_5$, corresponding to the via $R_5$ in FIG. 6, is on the amplifier side of the junction 38. Accordingly, the resistance $R_5$ forms part of the feedback loop for the feedback resistor 28 and is not "seen" by the photocurrent arriving at the node 38 from the photodiode. Thus, while the actual connecting paths between the photodiode 10 and the input node 30 of the amplifier 26 are identical in the structures shown in FIGS. 4 and 6 (the via $V_6$ in FIG. 6 corresponding to the thickness of the metal layer $M_2$ in FIG. 4), in the arrangement shown in FIG. 6, the resistance of the via $V_5$ has no effect on the series resistance 18 of the photodiode.

Another change evident from a comparison of FIGS. 5 and 7 is that the total resistance in the connecting path from the feedback resistor 28 to the input node 30 of the amplifier 30 is increased. However, the sum of all the connecting path resistances in the feedback resistor loop is quite small in comparison with the impedance of the feedback circuit element 28 and the input impedance of the amplifier, hence have no effect on the operation of the amplifier 26.

Accordingly, by arranging that the junction between the path from the photodiode and the feedback resistor is made at the point of connection of the photodiode with the connecting structure, it is assured that the resistances of the paths through the connecting structure have no adverse effects. This reduces the quality standards required of the connecting structures.

What is claimed is:

1. The combination of a photodiode and an integrated circuit including a semiconductor substrate and an interconnecting structure on a surface of the substrate, said substrate including an amplifier having an input terminal and a circuit element included within a feedback loop around said amplifier, said photodiode being mounted on a conductive mounting pad on said connecting structure at a position spaced from said amplifier and being electrically connected to said amplifier input node by a conductive first path through said connecting structure, said circuit element being electrically connected to said amplifier input node by a conductive second path through said connecting structure forming a junction with said first path, and said junction being at said mounting pad.

2. The combination of claim 1 wherein said circuit element is a resistor.

3. The combination of claim 1 wherein said interconnecting structure comprises a stack formed from layers of metal spaced apart by layers of insulating material, and metal vias interconnecting respective metal layers through intervening insulating layers.

4. The combination of claim 3 wherein one of said insulating material layers forms a top surface of the stack, said mounting pad being part of a metal layer on said top surface connected by first and second spaced apart vias passing through said one insulating material layer, said first via being part of said conductive first path to said amplifier input node, and said second via being part of said conductive second path to said circuit element.

5. The combination of claim 4 wherein said second via is connected to a first layer of metal spaced from the top surface of said stack by said one insulating material layer.

6. The combination of claim 5 wherein said first metal layer is spaced from said substrate surface by a second layer of insulating material and is connected to a first terminal of said circuit element by a third via passing through said second layer of insulating material.

7. The combination of claim 6 wherein a second terminal of said circuit element is connected to an output node of said amplifier.

8. The combination of claim 7 wherein said second terminal of said circuit element is connected to said amplifier output node by means of a second metal path and interconnecting vias within said stack.

9. The combination of claim 4 wherein said conductive first path comprises said first via joined directly in line with other vias for extension entirely through said stack and into contact with said amplifier input node.

* * * * *